(12) United States Patent
Tamura

(10) Patent No.: US 6,903,522 B2
(45) Date of Patent: Jun. 7, 2005

(54) SIMPLE LOAD-DRIVING CIRCUIT CAPABLE OF DRIVING PLURAL LOADS ACCORDING TO GIVEN PRIORITY ORDER

(75) Inventor: Hideki Tamura, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/759,329

(22) Filed: Jan. 16, 2004

(65) Prior Publication Data

US 2004/0145329 A1 Jul. 29, 2004

(30) Foreign Application Priority Data

Jan. 21, 2003 (JP) ........................................ 2003-012399

(51) Int. Cl.[7] .............................................. H02P 7/68
(52) U.S. Cl. .............................. 318/34; 318/49; 318/51; 318/85
(58) Field of Search ............................. 318/34, 47, 49, 318/51, 85, 798–815

(56) References Cited

U.S. PATENT DOCUMENTS

| | | | |
|---|---|---|---|
| 4,349,772 A | * 9/1982 | Weiss | 318/799 |
| 4,376,896 A | 3/1983 | Takeda et al. | |
| 5,065,302 A | * 11/1991 | Kanazawa | 363/37 |
| 5,121,038 A | 6/1992 | Yamamura et al. | |
| 5,414,339 A | * 5/1995 | Masaki et al. | 318/800 |
| 5,712,540 A | * 1/1998 | Toda et al. | 318/46 |
| 6,486,632 B2 | * 11/2002 | Okushima et al. | 318/599 |

FOREIGN PATENT DOCUMENTS

| | | |
|---|---|---|
| DE | 204 597 | 11/1983 |
| DE | 33 34 317 | 10/1984 |
| DE | 34 23 830 | 1/1986 |
| EP | 0 777 029 | 6/1997 |
| JP | 08105270 | 4/1996 |
| JP | 8-105270 | 4/1996 |

OTHER PUBLICATIONS

*Taschenbuch der Elektrotechnik und Elektronik*, Helmut Lindner Dec. 31, 1995 pp. 515–518—XP002293054.

* cited by examiner

*Primary Examiner*—Rina Duda
(74) *Attorney, Agent, or Firm*—Brinks Hofer Gilson & Lione

(57) ABSTRACT

A load-driving circuit capable of driving a plurality of loads based on a priority order endowed therewith is provided. The load-driving circuit comprises a first load 3, a first driving switch 1 for driving the first load, a second load 4, a second driving switch 2 for driving the second load, first switching means 5 being turned on when the first driving switch is switched to a position where the first load is driven, second switching means 6 being turned on when the second driving switch is switched to a position where the second load is driven, and third switching means 7 for disconnecting the first load from the grounding terminal when the first switching means 5 and the second switching means 6 are turned on at the same time.

3 Claims, 2 Drawing Sheets

SIMPLE LOAD-DRIVING CIRCUIT CAPABLE OF DRIVING PLURAL LOADS ACCORDING TO GIVEN PRIORITY ORDER

This application claims the benefit of priority to Japanese Patent Application No. 2003-012399, herein incorporated by reference.

BACKGROUND OF THE INVENTION

1. Field of the Invention

The present invention relates to a load-driving circuit for driving loads such as motors, and more particularly, to a load-driving circuit capable of driving a plurality of loads based on a priority order endowed therewith.

2. Description of the Related Art

Disclosed in, for instance, Japanese Unexamined Patent Application Publication No. 8-105270 is a power window apparatus with plural sets of driving devices, each having a power window motor and a power window switch for driving the power window motor, in which the operation of the power window switch with the highest priority order takes precedence, and the operation of the remaining switches is invalidated, when a plurality of the power window switches operates at the same time.

The conventional power window apparatus described above is constructed with a microcomputer. Therefore, the apparatus can be driven in accordance with the predetermined order of priority given to the power window driving motors by the programs incorporated into the microcomputer. Furthermore, a control method thereof can be easily changed, thereby improving the convenience of use and scalability.

However, if two sets of driving devices are provided, a microcomputer and peripheral circuits related thereto are required in order to determine the priority order of power window switches. Therefore, employing a circuit device for endowing a priority order is costly and tends to increase the size of the power window apparatus.

SUMMARY OF THE INVENTION

The present invention has been designed to solve the above-described problems, and it is an object of the present invention to provide a simple load-driving circuit capable of driving a plurality of loads based on a priority order endowed therewith.

In order to achieve the above object, a load-driving circuit in accordance with one aspect of the present invention comprises the following components: a first load; a first driving switch for driving the first load; a second load; a second driving switch for driving the second load; first switching means being turned on when the first driving switch is switched to a position where the first load is driven; second switching means being turned on when the second driving switch is switched to a position where the second load is driven; and third switching means for ceasing driving the first load when the first switching means and the second switching means are turned on at the same time. In this construction, a plurality of loads (first and second loads) can be driven by a simple circuit based on the priority order endowed therewith.

Furthermore, a load-driving circuit in accordance with another aspect of the present invention comprises the following components: a first motor; a first driving switch including a first switch connecting one terminal of the first motor to either a power supply terminal or a ground terminal, and a second switch connecting the other terminal of the first motor to either the power supply terminal or the ground terminal; a second motor; a second driving switch including a third switch connecting one terminal of the second motor to either the power supply terminal or the ground terminal, and a fourth switch connecting the other terminal of the second motor to either the power supply terminal to the ground terminal; first switching means being turned on when the first switch or the second switch operates; second switching means being turned on when the third switch or the fourth switch operates; and third switching means for disconnecting either terminal of the first motor from the power supply terminal or the ground terminal when the first switching means and the second switching means are turned on at the same time. According to such construction, a plurality of loads (first and second motors capable of rotating in forward and reverse directions) can be driven with a simple circuit based on the priority order endowed therewith.

DESCRIPTION OF THE PREFERRED EMBODIMENT

Figure 1:
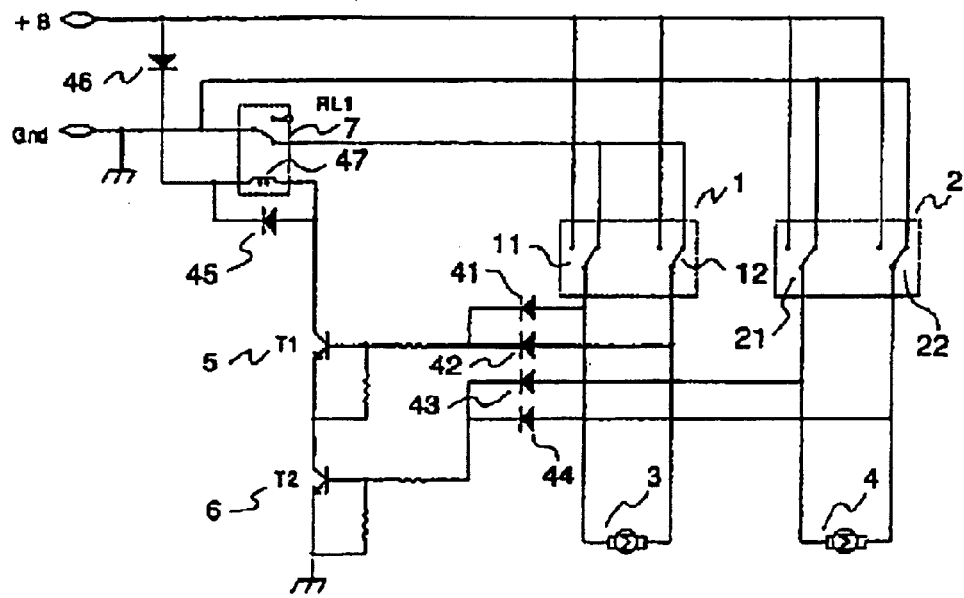
FIG. 1 is a view illustrating a load-driving circuit according to an embodiment of the present invention.

The present invention will now be described in greater detail with reference to the accompanying drawings. FIG. 1 is a view illustrating a load-driving circuit according to an embodiment of the present invention. In FIG. 1, symbol +B designates a direct current source, reference numeral 1 designates a first driving switch, and reference numeral 3 designates a first load including a motor driven by the first driving switch. The first driving switch 1 comprises a first changeover switch 11 that connects one end (one terminal) of the first load 3 to a terminal of the direct current source +B, or to a ground terminal GND through third switching means 7, and a second changeover switch 12 that connects the other end (the other terminal) of the first load 3 to the terminal of the direct current source +B, or to the ground terminal GND through the third switching means 7.

Reference numeral 2 designates a second driving switch, and reference numeral 4 designates a second load including a motor driven by the second driving switch. The second driving switch 2 comprises a third changeover switch 21 that connects one end (one terminal) of the second load 4 to either the terminal of the direct current source +B or the ground terminal GND, and a fourth changeover switch 22 that connects the other end (the other terminal) of the second load 4 to either the terminal of the direct current source +B or the ground terminal GND.

Reference numeral 5 designates first switching means composed of a transistor and the like, reference numeral 6 designates second switching means composed of a transistor and the like, which is connected in series to the first switching means 5, and reference numeral 7 designates third switching means composed of a relay and the like. Furthermore, the third switching means 7 is in an off state when the first switching means 5 and the second switching means 6 are in an on state.

Reference numerals 41 and 42 designate diodes, which connect a base electrode of a transistor T1 constituting the first switching means to both terminals of the first load, and reference numerals 43 and 44 designate diodes, which connect a base electrode of a transistor T2 constituting the second switching means to both terminals of the second load. Reference numerals 45 and 46 designate diodes, and reference numeral 47 designate an exciting coil of a relay constituting the third switching means.

In FIG. 1, when one end of the first load 3 is connected to the direct current source +B by operating one changeover switch (for example, the first changeover switch 11) of the first driving switch 1, a motor, which is the first load 3, is driven in one direction. Further, when the other end of the first load 3 is connected to the direct current source +B by operating the other changeover switch (for example, the second changeover switch 12) of the first driving switch 1, the motor, which is the first load 3, is driven in a direction opposite to the above direction.

Similarly, when one end of the second load 4 is connected to the direct current source +B by operating one changeover switch (for example, the third changeover switch 21) of the second driving switch 2, a motor, which is the second load 4, is driven in one direction. Further, when the other end of the second load 4 is connected to the direct current source +B by operating the other changeover switch (for example, the fourth changeover switch 22) of the second driving switch 2, the motor, which is the second load 4, is driven in a direction opposite to the above direction.

In such a situation, when one end of the first load 3 is connected to the direct current source +B by operating one changeover switch (for example, the first changeover switch 11) of the first driving switch 1 as described above, a base electrode of the transistor T1 constituting the first switching means 5 is supplied with a bias voltage through the diode 41. Further, when the other end of the first load 3 is connected to the direct current source +B by operating the other changeover switch (for example, the second changeover switch 12) of the first driving switch 1, the base electrode of the transistor T1 constituting the first switching means 5 is supplied with a bias voltage through the diode 42.

Similarly, when one end of the second load 4 is connected to the direct current source +B by operating one changeover switch (for example, the third changeover switch 21) of the second driving switch 2, a base electrode of the transistor T2 constituting the second switching means 6 is supplied with a bias voltage through the diode 43. Further, when the other end of the second load 4 is connected to the direct current source +B by operating the other changeover switch (for example, the fourth changeover switch 22) of the second driving switch 2, the base electrode of the transistor T2 constituting the second switching means 6 is supplied with a bias voltage through the diode 44.

In other words, when one end of the first load 3 is connected to the direct current source +B by operating any one of the changeover switches in the first driving switch 1, the base electrode of the transistor T1 constituting the first switching means 5 is supplied with a bias voltage through the diode 41 or the diode 42. Similarly, when one end of the second load 4 is connected to the direct current source +B by operating any one of the changeover switches in the second driving switch 2, the base electrode of the transistor T2 constituting the second switching means 6 is supplied with a bias voltage through the diode 43 or the diode 44.

Accordingly, when one end of the first load 3 is connected to the direct current source +B by operating any one of the changeover switches in the first driving switch 1 the moment that one end of the second load 4 is connected to the direct current source +B by operating any one of the changeover switches in the second driving switch 2, the transistor T1 constituting the first switching means 5 and the transistor T2 constituting the second switching means 6 are turned on at the same time. Consequently, the third switching means 7 is turned off, and thus one end of the first load 3 is disconnected from the ground terminal GND.

That is, if one of the changeover switches in the first driving switch 1 is simultaneously operated with the operation of one of the changeover switches in the second driving switch 2, only the second load 4 having the higher priority is driven.

Figure 2:
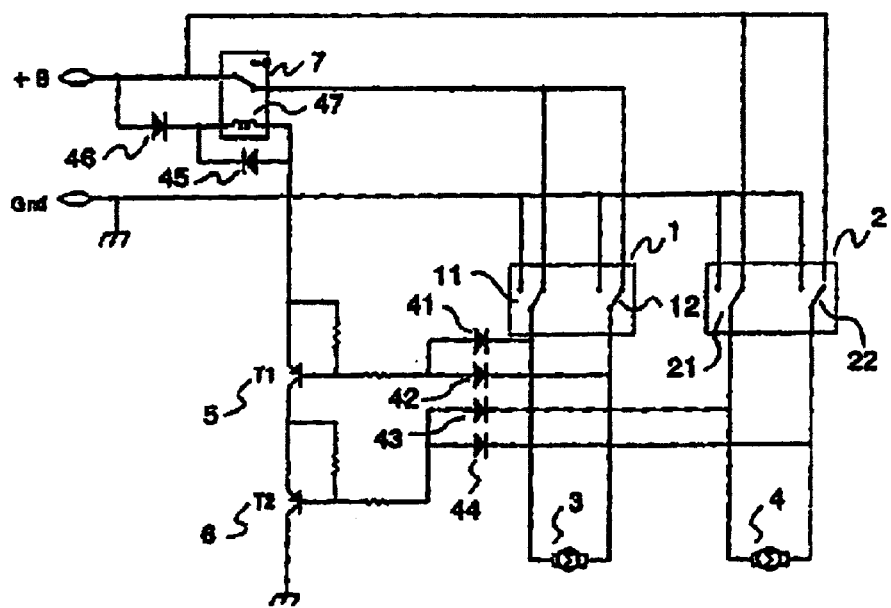
FIG. 2 is a view illustrating a load-driving circuit according to another embodiment of the present invention.

FIG. 2 is a view illustrating a load-driving circuit according to another embodiment of the present invention. In FIG. 2, reference numeral T1 designates a transistor that constitutes the first switching means 5, and reference numeral T2 designates a transistor that constitutes the second switching means 6. Although NPN-type transistors have been employed as transistors constituting the first switching means 5 and the second switching means 6 in the aforementioned embodiment shown in FIG. 1, PNP-type transistors are employed for that purpose in the present embodiment. Furthermore, in line with this change of transistors, the diodes 41, 42, 43 and 44 are connected in the opposite direction to those in the above embodiment. Moreover, the third switching means 7 is connected between either end of the first load 3 and the terminal of the direct current source +B. Because the operation of the circuit is the same as that of the above embodiment, a detailed description thereof is omitted.

Figure 3:
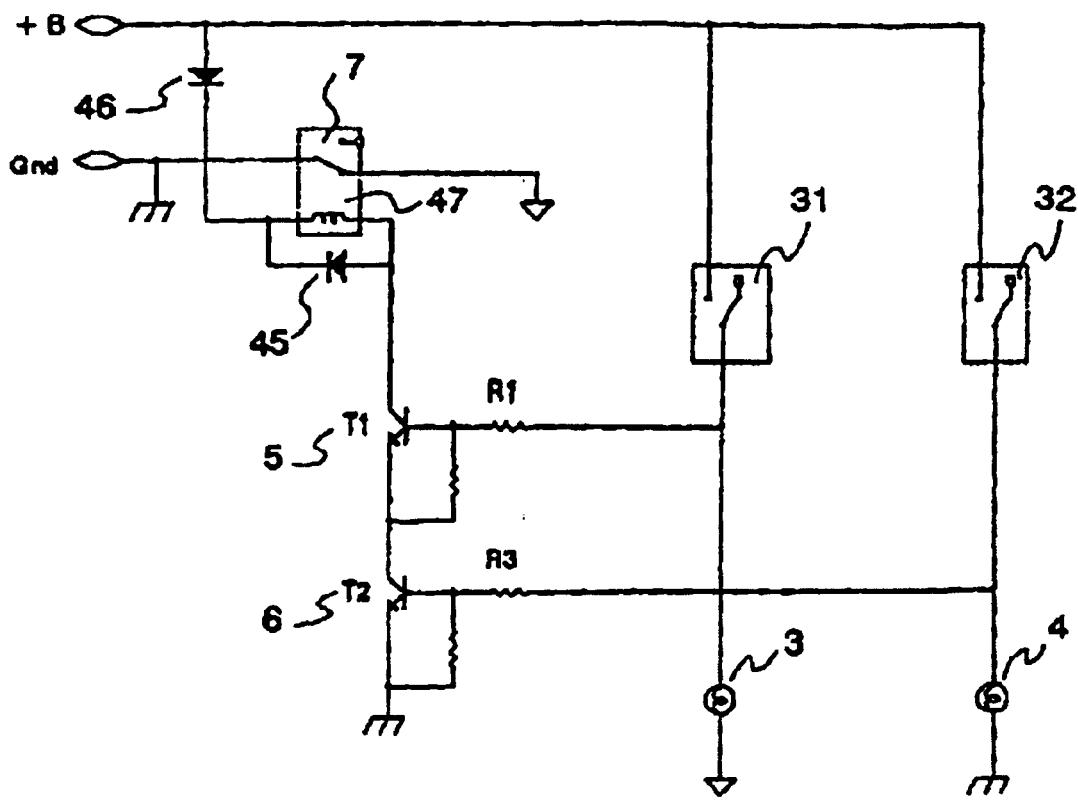
FIG. 3 is a view illustrating a load-driving circuit according to still another embodiment of the present invention.

FIG. 3 is a view illustrating a load-driving circuit according to still another embodiment of the present invention. In FIG. 3, reference numeral 31 designates a first driving switch, and reference numeral 3 designates a first load such as a lamp driven by the first driving switch. The first driving switch 31 connects one end of the first load 3 to a direct current source +B.

Reference numeral 32 designates a second driving switch, and reference numeral 4 designates a second load such as a lamp driven by the second switch. The second driving switch 32 connects one end of the second load 4 to the direct current source +B.

Reference numeral 7 designates third switching means including a relay, which connects the other end of the first load 3 to the ground terminal GND.

In addition, a base electrode of the transistor T1 constituting the first switching means 5 and one end of the first load 3 are connected to each other through a bias resistor R1. Similarly, a base electrode of the transistor T2 constituting the second switching means 6 and one end of the second load 4 are connected to each other through a bias resistor R3. In FIG. 3, the parts that are the same as those depicted in FIG. 1 are designated with the same reference numerals, and a description thereof is omitted in order to avoid redundancy.

In the present embodiment, when one end of the first load 3 is connected to the direct current source +B by operating the first driving switch 31 the moment that one end of the second load 4 is connected to the direct current source +B by operating the second driving switch 32, the transistors T1 constituting the first switching means 5 and T2 constituting the second switching means 6 are turned on at the same time. Consequently, the third switching means is turned off, and thus one end of the first load 3 is disconnected from the ground terminal GND.

That is, when the first driving switch 31 and the second driving switch 32 operate simultaneously, only the second load 4 having the higher priority is driven.

As described above, according to the present invention, a plurality of loads can be driven according to the priority order endowed therewith with a simple circuit and without using a microcomputer.

What is claimed is:

1. A load-driving circuit comprising:

a first load;

a first driving switch for driving the first load;

a second load;

a second driving switch for driving the second load;

first switching means being turned on when the first driving switch is switched to a position where the first load is driven;

second switching means being turned on when the second driving switch is switched to a position where the second load is driven; and third switching means for ceasing driving the first load when the first switching means and the second switching means are turned on at the same time.

2. A motor driving circuit comprising:

a first motor;

a first driving switch including a first switch connecting a first terminal of the first motor to a power supply terminal, and a second switch connecting a second terminal of the first motor to a ground terminal;

a second motor;

a second driving switch including a third switch connecting a first terminal of the second motor to the power supply terminal, and a fourth switch connecting a second terminal of the second motor to the ground terminal;

first switching means being turned on when the first switch or the second switch operates;

second switching means being turned on when the third switch or the fourth switch operates; and third switching means for disconnecting the first terminal of the first motor from the power supply terminal or the second terminal of the first motor from the ground terminal when the first switching means and the second switching means are turned on at the same time.

3. A load-driving circuit comprising:

a first load and a first switch connected between a power supply terminal and a ground terminal;

a second load and a second switch connected between a power supply terminal and a ground terminal;

first switching means connected to the first switch, wherein when the first switch is operated, the first load is driven by being connected to the power supply terminal and the ground terminal, and a bias voltage is applied to the first switching means to turn on the first switching means;

second switching means connected to the second switch, wherein when the second switch is operated, the second load is driven by being connected to the power supply terminal and the ground terminal, and the bias voltage is applied to the second switching means to turn on the second switching means; and third switching means connected between the first switch and the ground terminal or between the first switch and the power supply terminal, wherein a portion for controlling a switching operation of the third switching means is connected in series with the first switching means and the second switching means, the portion for controlling the switching operation of the third switching means operates the third switching means when the first switching means and the second switching means are turned on, whereby when the first switch and the second switch are simultaneously operated, both the first switching means and the second switching means are turned on, and the third switching means is operated to cease driving the first load.

* * * * *